United States Patent

Huang et al.

[11] Patent Number: 5,969,462
[45] Date of Patent: Oct. 19, 1999

[54] EXTENSIONAL MODE PIEZOELECTRIC CRYSTAL RESONATOR WITH SPLIT ELECTRODES AND TRANSFORMER DRIVING CIRCUIT

[75] Inventors: Jin Huang, Hoffman Estates; Charles L. Zimnicki, Bartlett; John E. Mattson, Streamwood, all of Ill.

[73] Assignee: CTS Corporation, Elkhart, Ind.

[21] Appl. No.: 09/099,156

[22] Filed: Jun. 18, 1998

[51] Int. Cl.[6] .............................. H03H 9/15; H01L 41/107
[52] U.S. Cl. ........................ 310/318; 310/319; 310/359; 310/366
[58] Field of Search .................... 310/316, 318, 310/319, 357, 359, 366

[56] References Cited

U.S. PATENT DOCUMENTS

| | | | |
|---|---|---|---|
| 2,157,701 | 5/1939 | Hight | 310/319 |
| 2,284,753 | 6/1942 | Mason | 310/366 |
| 2,830,274 | 4/1958 | Rosen et al. | 333/32 |
| 3,683,210 | 8/1972 | Kawada | 310/318 |
| 3,764,848 | 10/1973 | Berlincourt | 315/55 |
| 3,909,641 | 9/1975 | Ohshima et al. | 310/366 |
| 4,336,510 | 6/1982 | Miyamori | 310/366 |
| 4,947,074 | 8/1990 | Suzuki | 310/316 |
| 5,204,576 | 4/1993 | Mitsuyasu | 310/317 |
| 5,208,505 | 5/1993 | Mitsuyasu | 310/317 |
| 5,229,680 | 7/1993 | Sato et al. | 310/339 |
| 5,329,200 | 7/1994 | Zaitsu | 310/316 |
| 5,341,061 | 8/1994 | Zaitsu | 310/318 |
| 5,365,141 | 11/1994 | Kawai et al. | 310/359 |
| 5,371,430 | 12/1994 | Sato et al. | 310/359 |
| 5,394,048 | 2/1995 | Yamashita et al. | 310/316 |
| 5,402,031 | 3/1995 | Tagami et al. | 310/359 |
| 5,424,602 | 6/1995 | Sato et al. | 310/359 |
| 5,463,266 | 10/1995 | Fukuoka et al. | 310/359 |
| 5,612,597 | 3/1997 | Wood | 315/293 |
| 5,644,273 | 7/1997 | Kaida et al. | 333/187 |
| 5,675,208 | 10/1997 | Huang et al. | 310/360 |
| 5,747,914 | 5/1998 | Huang et al. | 310/318 |
| 5,763,983 | 6/1998 | Huang | 310/360 |
| 5,866,969 | 2/1999 | Shimada et al. | 310/318 |

FOREIGN PATENT DOCUMENTS

| | | | |
|---|---|---|---|
| 406132580 | 5/1994 | Japan | H01L 41/107 |

*Primary Examiner*—Thomas M. Dougherty
*Attorney, Agent, or Firm*—Jones, Day, Reavis & Pogue

[57] ABSTRACT

A piezoelectric resonator (10) includes a single crystal elongated plate (12) having a transverse extensional mode of oscillation. Two sets of split electrodes (20,22,30,32) are provided on the surfaces (14,16) of the plate (12) to define two acoustically coupled oscillating regions (24,26) therebetween. The oscillating regions (24,26) present a similar inductance and have similar performance to allow the use of the resonator (10) in a double-ended electrical transformer circuit (100). An AC source (112) drives non-opposing top and bottom electrodes of the resonator (110). The remaining electrodes are coupled with shunt capacitors to provide two resonant LC circuits with the resonator (110) so as to provide a voltage gain for driving a load.

20 Claims, 4 Drawing Sheets

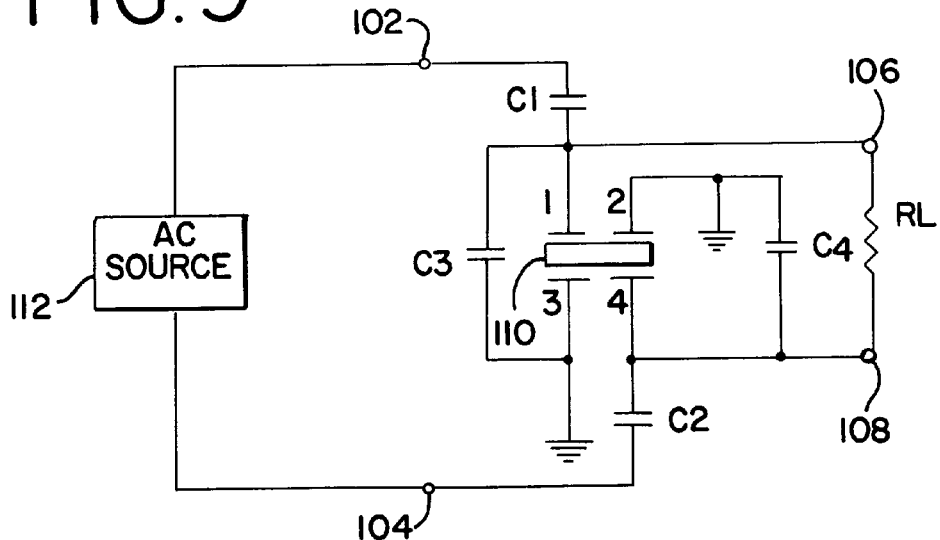
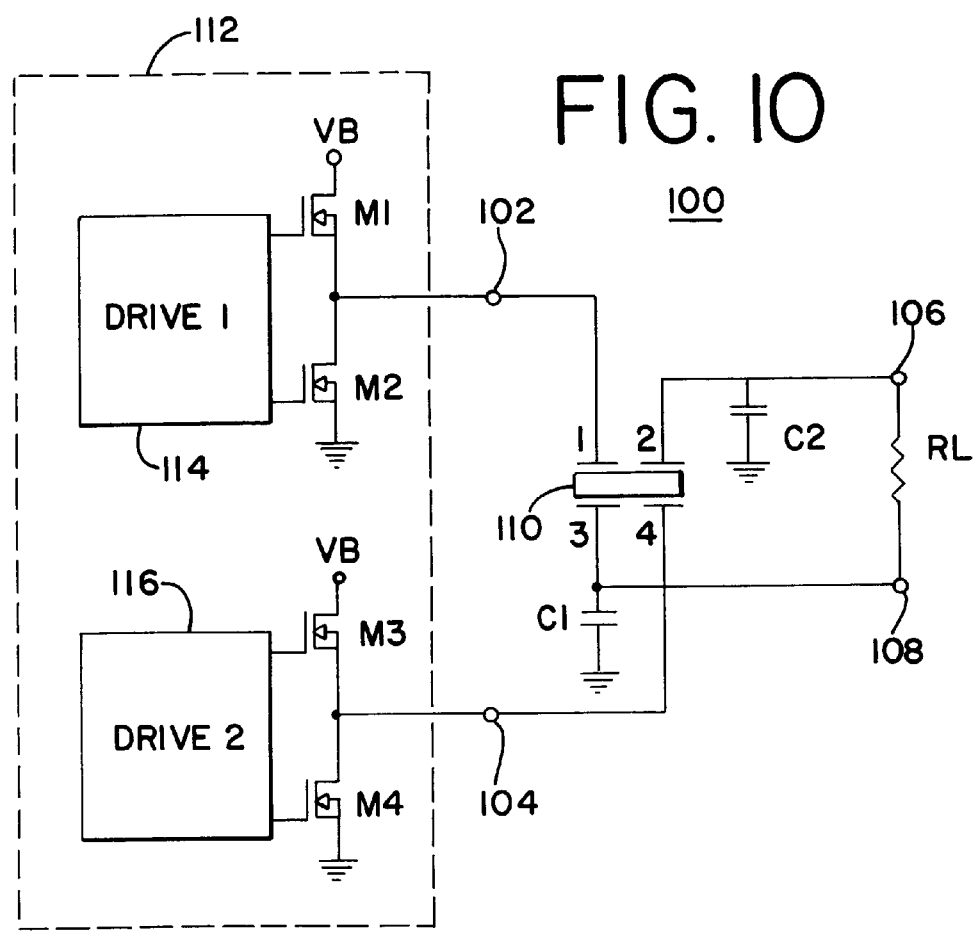

5,969,462

EXTENSIONAL MODE PIEZOELECTRIC CRYSTAL RESONATOR WITH SPLIT ELECTRODES AND TRANSFORMER DRIVING CIRCUIT

FIELD OF THE INVENTION

The invention relates generally to the field of piezoelectric resonators, and in particular, to an extensional mode single crystal piezoelectric resonator used in a transformer circuit.

BACKGROUND OF THE INVENTION

Prior art piezoelectric transformers are based on the well known Rosen design (U.S. Pat. No. 2,830,274). These prior art transformer designs are of a piezoelectric ceramic plate which includes a driving section and a driven section which each have different polarizations. The different polarizations provide for the voltage transformation in these designs. However, these designs have several drawbacks. First, the piezoelectric plate must undergo special pre-processing in order to provide separately polarized sections. Second, the piezoelectric plate is limited in its power handling abilities. Third, in applications where a double-ended transformer design is needed, two transformers must be used having matched frequencies and impedances. However, it is very difficult to provide two resonators the have the same properties for all conditions, such as changing temperature and load conditions.

Generally, extensional mode resonators have opposing electrodes that cover essentially the whole top and bottom surfaces of a resonator substrate. In those applications requiring two resonators, such as in a double-ended transformer circuit, the resonators must be strongly coupled or of identical frequencies and impedance. Pairs of individual identical resonators can be made through tighter manufacturing tolerances and matching processes. However, both of these processes can be very costly.

The need exists for a new piezoelectric resonator which: includes strongly coupled oscillating sections, identical frequencies, and identical impedances that change similarly over time and temperature. In addition, it would be a benefit to provide these features in an simple, easily manufactured low cost device.

BRIEF DESCRIPTION OF THE DRAWINGS

FIG. 9 shows a simplified schematic diagram of the second circuit of FIG. 8 with additional tuning capacitors, in accordance with the present invention; and FIG. 10 shows a simplified schematic diagram of a preferred embodiment of the circuit of FIG. 5, in accordance with the present invention.

DETAILED DESCRIPTION OF THE PREFERRED EMBODIMENT

The present invention provides split electrodes on an extensional mode resonator. The split electrodes include strongly coupled oscillating regions therebetween. Preferably, the electrodes that are split have identical dimensions such that the properties of the oscillating regions are substantially the same, i.e. the frequencies, impedances and performance over time and temperature are substantially the same for the regions.

Advantageously, the regions are inherently matched by their proximity to each other on a single substrate which results in the aforementioned features. Also, this results in a simple, easily manufactured low cost device. The present invention provides a novel configuration of a piezoelectric resonator for applications where one or more of the following conditions is required: high coupling, DC voltage offsets between the halves, DC isolation from a load, the same resonant frequency for different load conditions, double-ended transformer circuits. One application example is when the resonator of the present invention is used in a resonator-type piezoelectric transformer circuit with a full-bridge driving circuit, the resonator can double the voltage transformation ratio of the transformer circuit while simultaneously lowering radiation losses.

Figure 1:
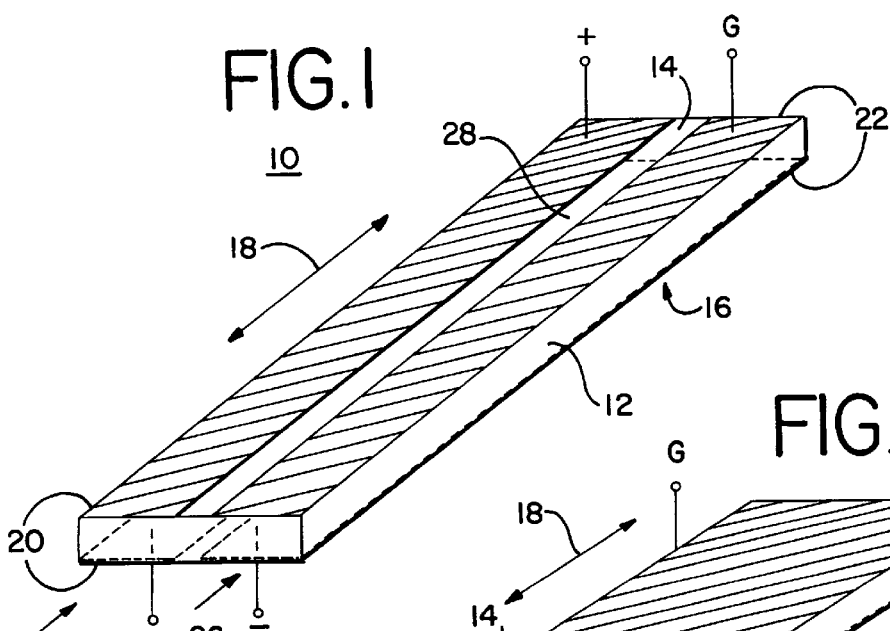
FIG. 1 shows a perspective view of a first embodiment of a piezoelectric extensional mode resonator driven in a fundamental longitudinal mode, in accordance with the present invention.

FIG. 1 shows a piezoelectric resonator 10 for use in a double-ended electrical transformer circuit. The resonator 10 includes a single crystal piezoelectric body 12 in the form of an elongated plate with an upper surface 14 and a lower surface 16. The plate exhibits a transverse extensional mode of oscillation 18 when excited. The resonator also includes a first and a second set 20,22 of substantially opposing electrode pairs disposed on the upper and lower surfaces 14,16 of the plate in proximity to one another and defining a first and a second oscillating region 24,26 therebetween, respectively. The first and second oscillating regions 24,26 are acoustically coupled. Preferably, the first and second oscillating regions 24,26 are strongly coupled.

The sets 20,22 opposing electrode pairs, when driven by an electrical signal producing an electric field in a thickness direction of the plate within the associated oscillating regions 24,26, generating a transverse extensional mode of oscillation 18 within the oscillating regions 24,26. In the present invention, the oscillating regions 24,26 present substantially the same impedance across their associated sets 20,22 of opposing electrode pairs.

FIG. 1 shows a first embodiment of a piezoelectric extensional mode resonator driven in a fundamental longitudinal mode. In this first embodiment, the plate has a width and has a length along a direction 18 of extensional mode oscillation. The electrodes of the sets 20,22 of opposing electrode pairs are substantially continuous along a length of the plate and are separated by a gap 28 running the length of the plate.

Both sets 20,22 of electrode pairs have the same relative applied voltage from the upper surface 14 of the plate 12 to the lower surface 16 at any instant in time. As shown, the first set 20 of electrodes has a positive relative voltage from (+) to ground, and the second set 22 of electrodes has a similar positive relative voltage from ground to (-). In addition, the sets 20,22 of electrode pairs maintain their relative voltage relationship when the resonator is driven by an AC source. In this way, the sets 20,22 of electrode pairs are driven in-phase, maintaining the same relative voltage, and act as one unbroken electrode pair by supporting the same common fundamental transverse extensional mode of oscillation within both acoustically coupled oscillating regions 24,26. Moreover, the gap 28 which splits the electrode pairs 20,22 isolates the electrodes and allows a DC offset in voltage between the electrode pairs 20,22. This allows an electric field across each gap 28 between sets 20,22 of electrodes to be about one half of a total voltage (i.e., the difference between (+) and (-)) applied to the resonator which allows the resonator to provide twice the voltage gain as prior art resonators used in transformer circuits.

Figure 2:
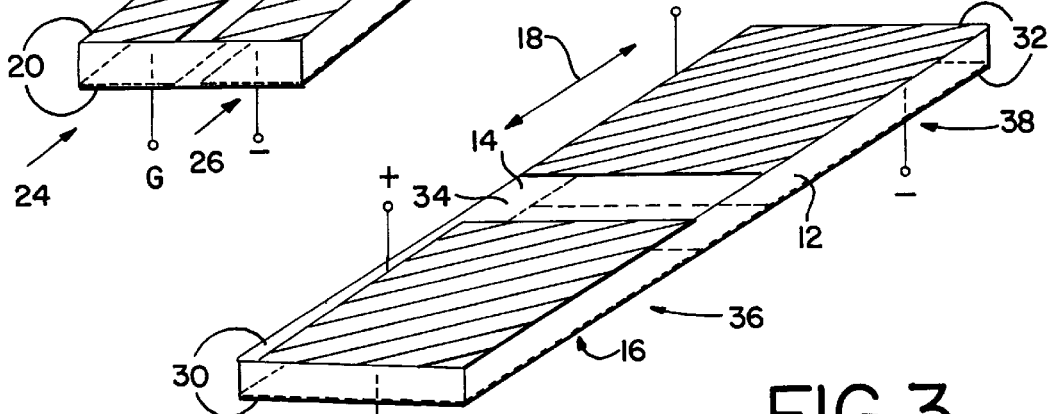
FIG. 2 shows a perspective view of a second embodiment of a piezoelectric extensional mode resonator driven in a fundamental longitudinal mode, in accordance with the present invention.

FIG. 2 shows a perspective view of a second embodiment of a piezoelectric extensional mode resonator driven in a fundamental longitudinal mode. The body 12 of the resonator and its mode of oscillation is the same as described in FIG. 1, and the associated references to the body 12 of FIG. 1 are hereby incorporated by reference. However, in this second embodiment, a first set 30 and second set 32 of opposing electrode pairs are substantially continuous along a width of the plate 12 and are separated by a gap 34 running the width of the plate 12.

Each set 30,32 of electrode pairs defines a respective first and second oscillating region 36,38 therebetween. As in the previous example, both sets 30,32 have the same relative applied voltage from the upper surface 14 of the plate 12 to the lower surface 16 at any instant in time. As shown, the first set 30 of electrodes has a positive relative voltage from (+) to ground, and the second set 32 of electrodes has a similar positive relative voltage from ground to (-). In this way, the sets 30,32 of electrode pairs are driven in-phase, maintaining the same relative voltage, and act as one unbroken electrode pair by supporting the same common fundamental transverse extensional mode of oscillation within both acoustically coupled oscillating regions 36,38. The gap 34 which splits the electrode pairs 30,32 isolates the electrodes and allows a DC offset in voltage between the electrode pairs 30,32. This allows an electric field across each gap 34 between sets 30,32 of electrodes to be about one half of a total voltage (i.e., the difference between (+) and (-)) applied to the resonator which allows the resonator to provide twice the voltage gain as prior art resonators used in transformer circuits.

Inasmuch as both of the resonators of FIGS. 1 and 2 are operable in a fundamental extensional mode, maximum stress and electric field are generated across the center of the body 12. A high level of localized stress in a piezoelectric body results in a localized high electric field, as is known in the art. This causes the potential of arcing across the respective gaps 28,34. Therefore, these first and second embodiments are most suited to low power applications. For high power applications the stress and field at the gap must be reduced.

Figure 3:
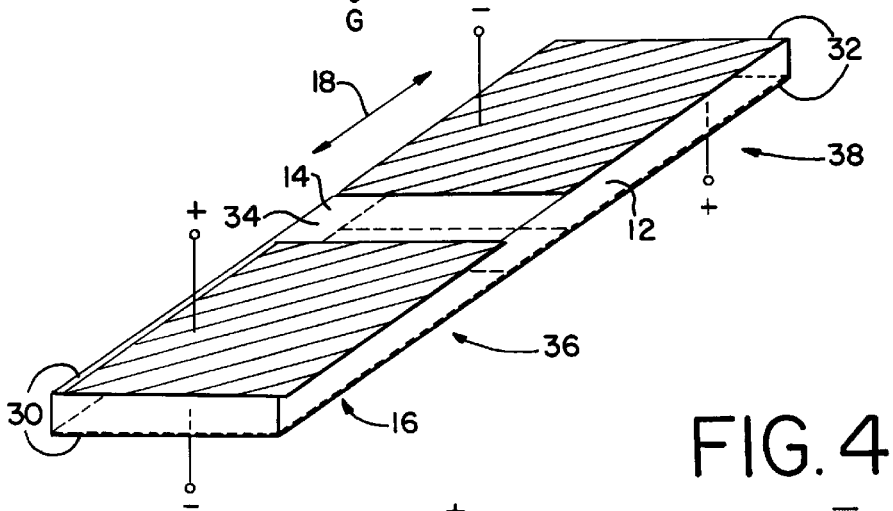
FIG. 3 shows a perspective view of a preferred embodiment of the resonator of FIG. 2 driven in a second harmonic mode.

FIG. 3 shows a preferred embodiment of the resonator of the present invention which lowers the risk for potential arcing between electrodes. The resonator of FIG. 3 is of the same configuration as that of FIG. 2, of which the description is hereby incorporated by reference, but is driven in a second harmonic mode. However, it should be recognized that any even mode of extensional oscillation would provide the same result.

Figure 4:
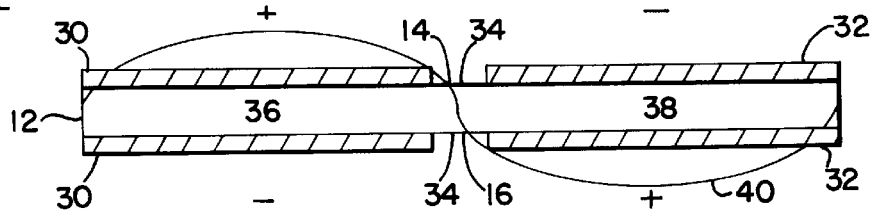
FIG. 4 shows a side view of the resonator of FIG. 3 with an overlying graphical representation of the longitudinal displacement exhibited by the resonator.

In particular, each set 30,32 of opposing electrode pairs has an opposite relative applied voltage from the upper surface 14 of the plate 12 to the lower surface 16 at any instant in time. As shown in FIGS. 3 and 4, the first set 30 of electrodes has a positive relative voltage from (+) to (-), and the second set 32 of electrodes has an opposite negative relative voltage from (-) to (+). In this way, the sets 30,32 of electrode pairs are driven about 180° out-of-phase from each other, generating an even mode (e.g. second harmonic) of transverse extensional oscillation in the plate 12 which results in a minimum extensional displacement 40 in the gap 34. The minimum in the extensional displacement 40 lowers the risk for potential arcing between electrodes.

In addition to the resonator embodiments described above, the present invention facilitates the use of a simple double-ended transformation circuit. Because the piezoelectric resonator used in the present invention acoustically operates in the same fashion as a basic two-terminal resonator, the configuration and implementation of the piezoelectric resonator is easier in comparison to other techniques. For example, a full-bridge electrical circuit can be used to drive the piezoelectric resonator directly, without the need for large and expensive magnetic elements such as inductors.

Electronic transformation circuits known in the art which use a piezoelectric resonator are generally made with a single-ended output. This is done because an implementation of a double-ended drive circuit requires either two piezoelectric elements or a complex piezoelectric element with an isolated electrode structure or multiple vibrational modes, or both. However, double-ended drive circuits are still desirable because of they provide several advantages. Firstly, a bipolar drive circuit reduces a transformation ratio by a factor of two which makes the transformation more efficient. Secondly, a double-ended drive circuit reduces an output voltage by a factor of 2, with respect to ground. Thirdly, a double-ended drive circuit dramatically reduces RF radiation because of its current symmetry and the use of lower voltages.

The present invention allows the use of a simple double-ended transformation circuit by providing split electrodes. The resonator of the present invention is similar to a simple two-electrode resonator with the exception of having the electrodes divided into two fragments which are preferably equal. From the perspective of acoustics, the characteristics of the resonator's mechanical motion are not changed from that of a single resonator or multiple separate resonators.

Figure 5:
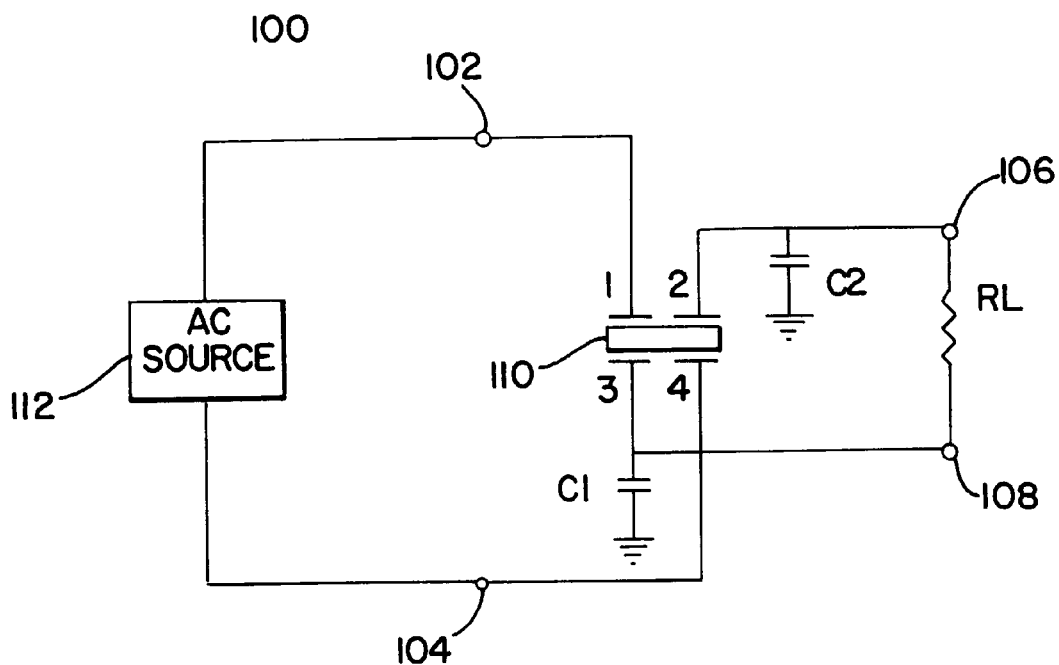
FIG. 5 shows a simplified schematic diagram of a first circuit usable in accordance with the present invention.

FIG. 5 shows a first embodiment of a drive circuit 100 for the piezoelectric resonators of the present invention to provide an electrical transformation. The drive circuit 100 includes first and second input connections 102,104, first and second output connections 106,108, first and second capacitors C1,C2, and a piezoelectric resonator 110 as described above (see FIG. 2, for example). The input connections 102,104 are adapted for receiving a source 112 of alternating current, and first and second output connections 106,108 are adapted for coupling to a load, RL. The first and second capacitors C1,C2 are each coupled in shunt at the first and second output connections 106,108, respectively. The resonator 110 has a first terminal that is coupled to first input connection 102, and a second terminal that is coupled to first output connection 106. The resonator 110 also has a third terminal that is coupled to second output connection 108 and a fourth terminal that is coupled to second input connection 104.

Ideally, the source 112 has balanced currents to both input connections 102, 104. In practice, the currents may become unbalanced. Therefore, it is preferred that the source 112 includes two AC drivers comprised of half-bridge circuits. The two drivers produce voltages with phases that are 180 degrees apart. The two voltages are referenced to a common ground potential that defines a center tap.

In practice, the resonator 110 is useful for power levels greater than 0.2 watts.

During operation of the drive circuit 100, the resonator 110 provides an inductive equivalent impedance across each opposing electrode pair and associated oscillating region, i.e., between both its first and third terminals and between the second and fourth terminals. That is, when excited at an appropriate frequency by the AC source 112, the resonator 110 provides the approximate terminal behavior of matched inductors. A load, RL, when connected to the output connections 106,108 is driven by two signals that are about equal in magnitude but offset in phase by about 180 degrees.

The capacitors C1,C2 may be realized by way of ordinary discrete capacitors or, at very high operating frequencies for which only a relatively small capacitance is needed, using embedded capacitance methods by which, for example, adjacent traces on a printed-circuit board are designed to provide a desired stray capacitance.

The resonator 110 can be implemented using any of a number of piezoelectric or ferroelectric materials that have high coupling coefficients and appropriate mechanical properties, examples of which are lithium niobate ($LiNbO_3$), lead zirconate titanate (PZT), or lithium tantalate ($LiTaO_3$). For example, the resonator 110 can be implemented on a substrate of Y-cut 135°±10° lithium niobate. Also, it should be appreciated that the geometries of plate, electrodes, and mounting structures are not limited to those shown in FIGS. 1 to 4, but can be modified in various ways to provide enhanced electrical and mechanical performance of resonator 110. For example, the substrate can be disk-shaped with contoured, as opposed to flat, surfaces. It should be recognized that the present invention is not limited to a particular type of piezoelectric resonator, mode of vibration, or piezoelectric material. Various other aspects relating to the fabrication and composition of a piezoelectric resonator are widely known by those skilled in the art of piezoelectric resonators and related devices.

Figure 6:
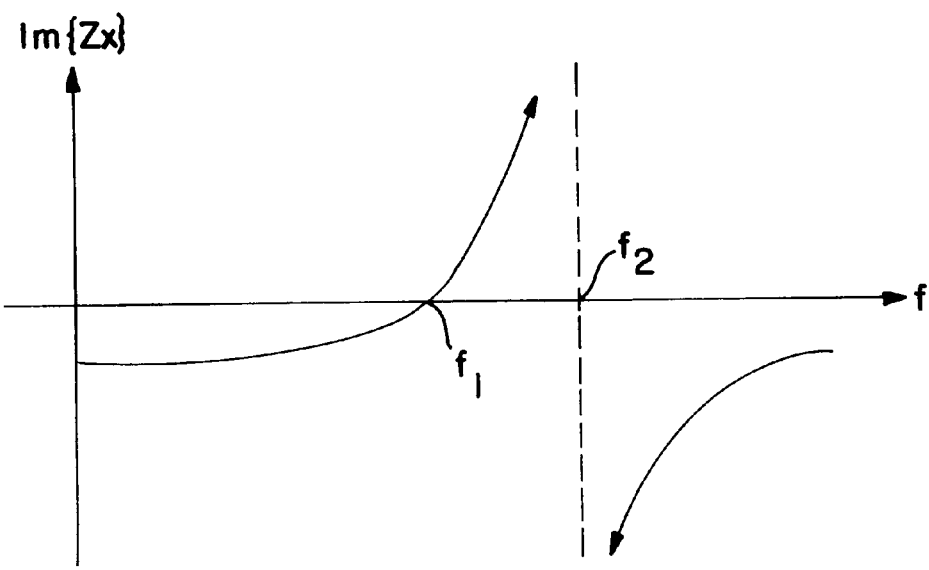
FIG. 6 is a sample plot of reactive impedance versus operating frequency for a piezoelectric resonator.

FIG. 6 is a sample plot of the imaginary, or reactive, portion of the terminal impedance, Zx, of the piezoelectric resonator as a function of operating frequency, f. When operated within the frequency range $f_1 < f < f_2$, the impedance, $Z_x$, of the resonator has a positive reactive component and is therefore approximately inductive. Depending on the type of material used for resonator, the inductive region $f_1 < f < f_2$ may include frequencies as low as 100 kilohertz and as high as several megahertz or greater.

Turning back to FIG. 5, when the resonator 110 is operated in the inductive region, the first and second capacitors C1,C2 and respective oscillating regions of the resonator 110 together function as two series resonant LC circuits in which each capacitor C1,C2 has a capacitance, C, and each oscillating region presents a substantially equal equivalent inductance, L. Because the inductive impedance of each oscillating region is accompanied by a resistive component that is very low in comparison with that of a magnetic inductor, each oscillating region has an extremely high quality factor. Also, because the oscillating regions are highly coupled, they provide matched impedances and resonant frequencies. Thus, provided that the impedance of the load, RL, is not extremely low relative to that of each oscillating region, the drive circuit 100 provides a high level of voltage gain (i.e., the voltage across RL divided by the voltage supplied by the AC source 112) when operated at or near the series resonant frequency of L and C.

Additionally, and in contrast to magnetic inductors, the inductance of each oscillating region is substantially linear in that L remains essentially constant over a wide range of excitation applied to each oscillating region. Thus, each oscillating region closely approximates an ideal (i.e., lossless and linear) inductor.

Figure 7:
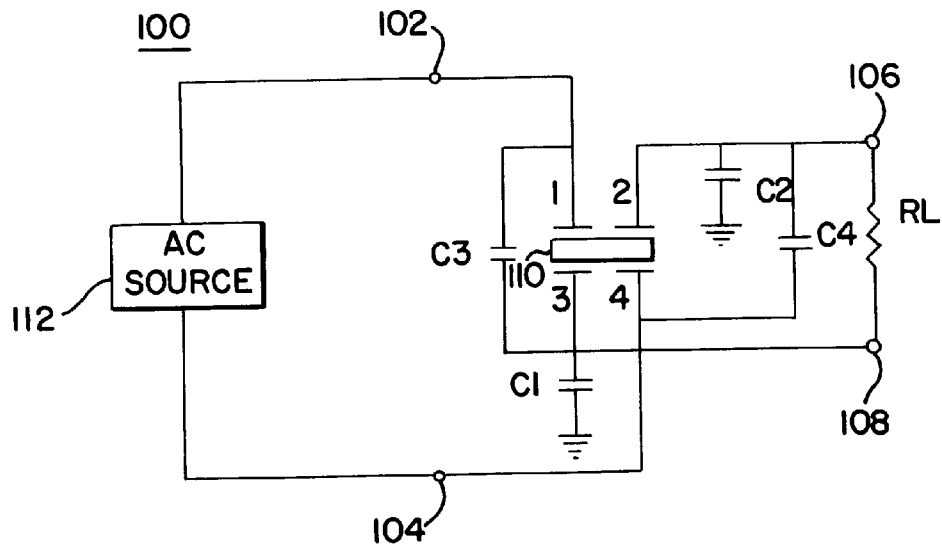
FIG. 7 shows a simplified schematic diagram of the first circuit of FIG. 5 with additional tuning capacitors, in accordance with the present invention.

As shown in FIG. 7, the drive circuit 100 optionally includes a third and fourth capacitor C3,C4 that are each coupled in parallel across each oscillating region of the resonator 110. The third and fourth capacitor C3,C4 serve as tuning capacitors for effectively modifying the apparent equivalent impedance of each oscillating region.

Figure 8:
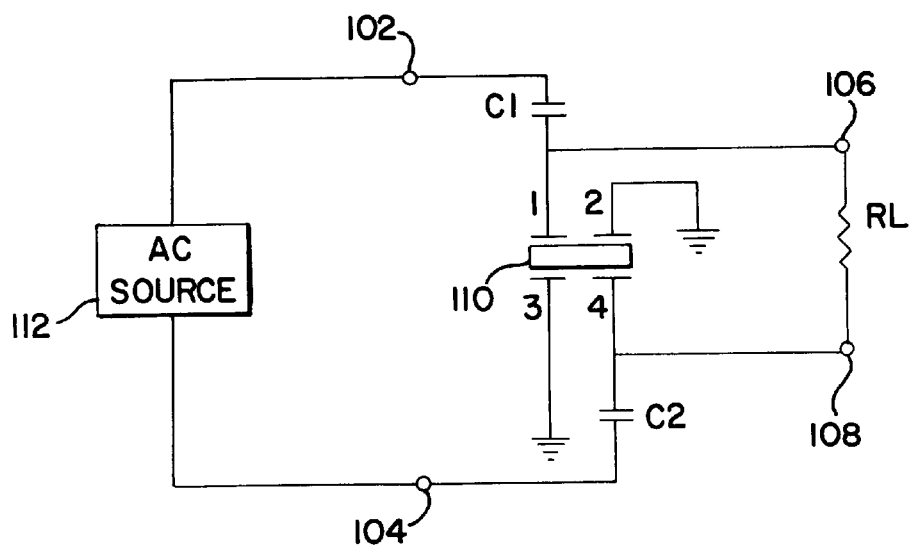
FIG. 8 shows a simplified schematic diagram of a second circuit usable in accordance with the present invention.

In an alternative embodiment of the drive circuit, as shown in FIG. 8, the relative connections of each oscillating region and their respective shunt capacitors C1,C2 are interchanged from that which is shown in FIG. 5. Specifically, the first capacitor, C1, is coupled between first input connection 102 and first output connection 106, and the first oscillating region of the resonator 140 (between terminals 1 and 3) is coupled in shunt at the first output connection 106. Similarly, the second capacitor, C2, is coupled between second input connection 104 and second output connection 108, and the second oscillating region of the resonator 110 (between terminals 2 and 4) is coupled in shunt at the second output connection 108. In comparison with the drive circuit 100 of FIG. 5, this circuit provides enhanced voltage gain at higher frequencies and is useful for those applications in which load current limiting is not required.

As shown in FIG. 9, a third and fourth capacitor C3,C4 can each be placed in parallel across each oscillating region of the resonator 110. As discussed previously with regard to FIG. 5, capacitors C3,C4 serve as tuning capacitors that effectively modify the impedance characteristics of the oscillating regions of the resonator 110 to allow for a lower operating frequency of the drive circuit.

FIG. 10 shows a preferred embodiment of the drive circuit 100 (as shown in FIG. 5) for the piezoelectric resonator of the present invention to provide an electrical transformation. The AC source 112 includes a first and second source circuit 114,116. The first source circuit 114 is used to drive two switches, M1 and M2. The second source circuit 116 is used to drive another two switches, M3 and M4. Preferably, the source circuits 114,116 are half-wave inverters and all of the switches M1–M4 are N-channel MOSFETs.

Generally, the AC voltage applied at the input connections 102,104 is of a square-wave form. This is done to improve the efficiency of switching circuitry used to drive the piezoelectric resonator 110. Usually, the switching circuitry is the least efficient portion of the drive circuit 100. Therefore, the drive signals used are optimized for this weakest link. However, it should be recognized that a sinewave could also be used to drive the input connections 102,104, in that, the use of a sinewave optimizes the efficiency of the piezoelectric portion (i.e. resonator 110) of the entire drive circuit 100. This is particularly advantageous when a switching power supply is not being used to drive the resonator 110. Preferably, the first and second source circuits 114,116 provide respective first and second signals being of about the same frequency and magnitude.

Each of the first and second source 114,116 is preferably implemented as a half-bridge type inverter, as is known in the art, that includes a first inverter switch M1(M3) coupled between a voltage supply, VB, and the associated input connection 102(104), and a second inverter switch M2(M4) coupled between associated input connection 104 and circuit ground. Although shown as field-effect transistors, inverter switches M1–M4 may be implemented using any of a number of suitable power switching devices, such as bipolar junction transistors.

Each inverter includes an inverter driver circuit that is coupled to the inverter switches M1–M4, and that is operable to commutate inverter switches M1–M4 in a substantially complementary fashion and at a high frequency rate at or near the series resonant frequency of capacitor/resonator LC series resonant circuits. Stated another way, the inverter driver circuit controls the conduction of inverter switches M1–M4 such that when switch M1(M4) is on, switch M2(M3) is off, and vice versa. The inverter driver circuits may be implemented as a dedicated driver circuit that includes, for example, an integrated circuit (IC) such as the IR2151 high-side driver IC manufactured by International Rectifier. Alternatively, the inverter driver circuits may be realized using any of a number of well known self-oscillating arrangements in which feedback from the drive circuit 100 is used to provide switching of inverter switches M1–M4.

In a conventional half-bridge inverter, a direct current (DC) blocking capacitor is typically required in order to provide a symmetrical square-wave output voltage, $V_{IN}$, at the input connections 102,104. This capacitance is implicitly provided by the resonator 110. That is, the internal motional capacitance, $C_m$, of each oscillating region of the resonator 110 provides the functionality of a DC blocking capacitor. Thus, the drive circuit 100 has the added benefit of eliminating the customary need for a separate DC blocking capacitor in a half-bridge inverter.

The resonator and drive circuit of the present invention, as well as their alternative embodiments and applications described herein, provides a number of significant advantages over existing circuits that use either magnetic inductors or conventional piezoelectric resonators. The drive circuit employs a structurally uncomplicated resonator to provide equivalent inductances that are matched and each closely approximates an ideal inductor. Consequently, the drive circuit provides significantly higher voltage gain and lower power dissipation than prior art circuits that use magnetic inductors. Related benefits are minimization of undesirable (and often unpredictable) non-linear effects, particularly at high operating frequencies, as well as reduced variation in circuit parameters. Furthermore, the drive circuit has an simple structure that obviates the need for dedicated circuitry for controlling the resonator. The result is a cost-effective drive circuit that is applicable to power supplies, discharge lamp ballasts, and other power electronic circuits and systems for which high energy efficiency, small size, and low weight are important considerations.

Although various embodiments of this invention have been shown and described, it should be understood that various modifications and substitutions, as well as rearrangements and combinations of the preceding embodiments, can be made by those skilled in the art, without departing from the novel spirit and scope of this invention.

What is claimed is:

1. A piezoelectric resonator for use in a double-ended electrical transformer circuit, comprising:

a single crystal piezoelectric body in the form of an elongated plate with an upper surface and a lower surface, the plate having a transverse extensional mode of oscillation; and a first and a second set of substantially opposing electrode pairs disposed on the upper and lower surfaces of the plate in proximity to one another and defining a first and a second oscillating region therebetween, respectively, the first and second regions being acoustically coupled;

the sets of opposing electrode pairs, when driven by an electrical signal producing an electric field in a thickness direction of the plate within the associated oscillating regions, generating a transverse extensional mode of oscillation within the oscillating regions; and the oscillating regions presenting substantially the same impedance across their associated sets of opposing electrode pairs.

2. The piezoelectric resonator of claim 1, wherein an impedance across each opposing electrode pair is inductive.

3. The piezoelectric resonator of claim 1, wherein the opposing electrode pairs, when driven in-phase with each other, generate a common fundamental transverse extensional mode of oscillation within the oscillating regions.

4. The piezoelectric resonator of claim 3, wherein the opposing electrode pairs are driven by offset voltages such that an electric field across each gap between electrodes is about one half of a total voltage applied to the resonator.

5. The piezoelectric resonator of claim 1, wherein the plate has a width and has a length along a direction of the extensional mode oscillation, and wherein the electrodes of the opposing electrode pairs are substantially continuous along a length of the plate and are separated by a gap running the length of the plate.

6. The piezoelectric resonator of claim 1, wherein the plate has a width and has a length along a direction of the extensional mode oscillation, and wherein the electrodes of the opposing electrode pairs are substantially continuous along a width of the plate and are separated by a gap running the width of the plate.

7. The piezoelectric resonator of claim 6, wherein the opposing electrode pairs, when driven about 180° out-of-phase from each other, generate an even mode of transverse extensional oscillation in the plate with minimum extensional displacement in the gap.

8. A piezoelectric resonator for use in a double-ended electrical transformer circuit, comprising:

a single crystal piezoelectric body in the form of an elongated plate with an upper surface and a lower surface, the plate having a width and having a length along a transverse extensional mode of oscillation; and a first and a second set of substantially opposing electrode pairs disposed on the upper and lower surfaces of the plate in proximity to one another and defining a first and a second oscillating region therebetween, respectively, the electrodes of the opposing electrode pairs being substantially continuous along a width of the plate and separated by a gap running the width of the plate, the first and second regions being acoustically coupled;

the opposing electrode pairs, when driven by electrical signals that are about 180° out-of-phase from each other producing opposing electric fields in a thickness direction of the plate within each driving region, generating an even mode of transverse extensional oscillation in the plate with minimum extensional displacement in the gap; and the oscillating regions presenting substantially the same inductive impedance across their associated opposing electrode pairs.

9. The piezoelectric resonator of claim 8, wherein the electrical signals are about equal in frequency and magnitude and are selected from one of the group of a square-wave form and a sinewave form.

10. The piezoelectric resonator of claim 8, wherein the opposing electrode pairs are driven such that an electric field across the gap is about one half of a total voltage applied to the resonator.

11. The piezoelectric resonator of claim 8, further comprising a driving circuit comprising:

an AC source coupled to a first and second input connections;

a first and second output connection being adapted for coupling to a load; and a first and second capacitor each being coupled in shunt at the first and second output connections, respectively;

the resonator having a first terminal being coupled to the first input connection, a second terminal being coupled to the first output connection, a third terminal being coupled to the second output connection, and a fourth terminal being coupled to the second input connection; and the AC source driving the first and fourth terminals with electrical signals that are about equal in frequency and magnitude and offset in phase by about 180 degrees and at a frequency such that the resonator provides an inductive equivalent impedance across the first and third terminals and across the second and fourth terminals.

12. The piezoelectric resonator and driving circuit of claim 11, further comprising a third and fourth capacitor that are each coupled in parallel across each oscillating region of the resonator so as to effectively modify an apparent equivalent impedance of each oscillating region of the resonator.

13. The piezoelectric resonator and driving circuit of claim 11, wherein the AC source includes a first and second source circuit, each source circuit controls two switches coupled in series between a voltage supply and ground, a junction between the switches being coupled to an associated input connection of the drive circuit, the source circuits are operable to commutate their associated switches in a substantially complementary fashion and at a high frequency rate at or near the series resonant frequency of the resonator.

14. The piezoelectric resonator and driving circuit of claim 13, wherein the source circuits are half-wave inverters.

15. The piezoelectric resonator and driving circuit of claim 13, wherein the switches N-channel MOSFETs.

16. The piezoelectric resonator of claim 8, further comprising a driving circuit comprising:

an AC source coupled to a first and a second input connection;

a first and second output connection being adapted for coupling to a load; and a first and second capacitor each being coupled in series between the first input and output connections and the second input and output connections, respectively;

the resonator having a first terminal being coupled to the first output connection, a second and third terminal being coupled to circuit ground, and a fourth terminal being coupled to the second output connection; and the AC source driving the first and fourth terminals through the first and second capacitors, respectively, with electrical signals that are about equal in frequency and magnitude and offset in phase by about 180 degrees and at a frequency such that the resonator provides an inductive equivalent impedance across the first and third terminals and across the second and fourth terminals.

17. The piezoelectric resonator and driving circuit of claim 16, further comprising a third and fourth capacitor that are each coupled in parallel across each oscillating region of the resonator so as to effectively modify an apparent equivalent impedance of each oscillating region of the resonator.

18. The piezoelectric resonator and driving circuit of claim 16, wherein the AC source includes a first and second source circuit, each source circuit controls two switches coupled in series between a voltage supply and ground, a junction between the switches being coupled to an associated input connection of the drive circuit, the source circuits are operable to commutate their associated switches in a substantially complementary fashion and at a high frequency rate at or near the series resonant frequency of the resonator.

19. The piezoelectric resonator and driving circuit of claim 18, wherein the source circuits are half-wave inverters.

20. The piezoelectric resonator and driving circuit of claim 18, wherein the switches are N-channel MOSFETs.

* * * * *